Figure 1:
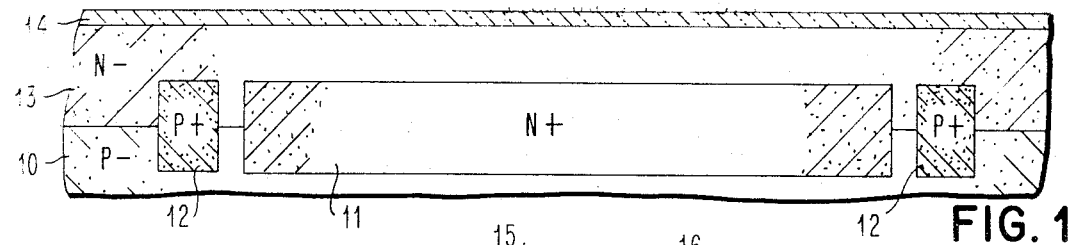
Figure 2:
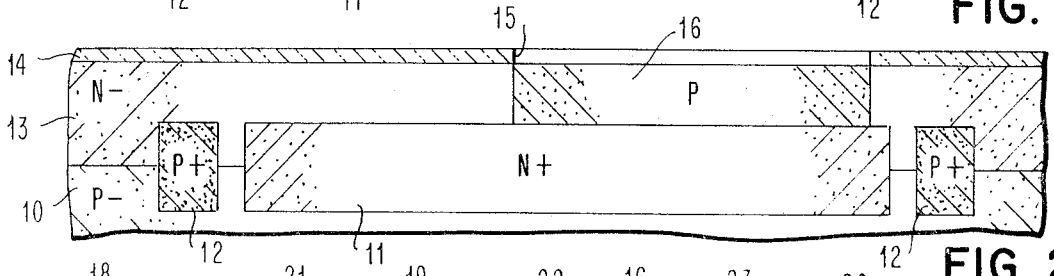
Figure 3:
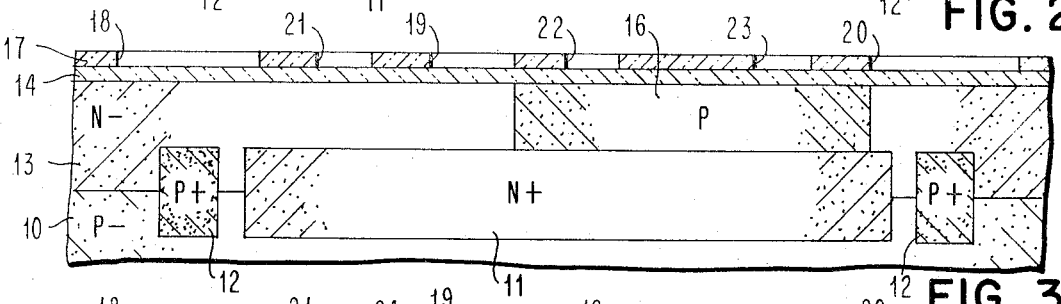
Figure 4:
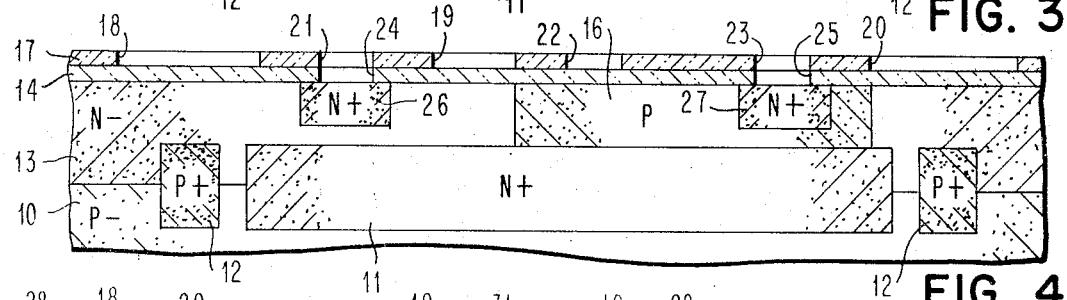
Figure 5:
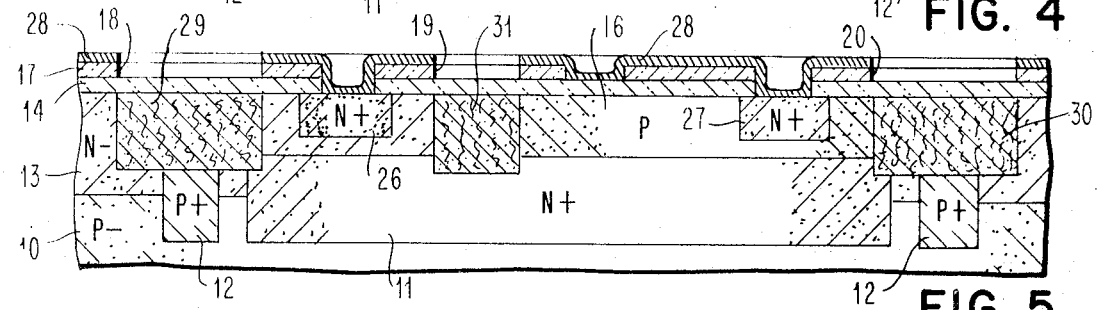
Figure 6:
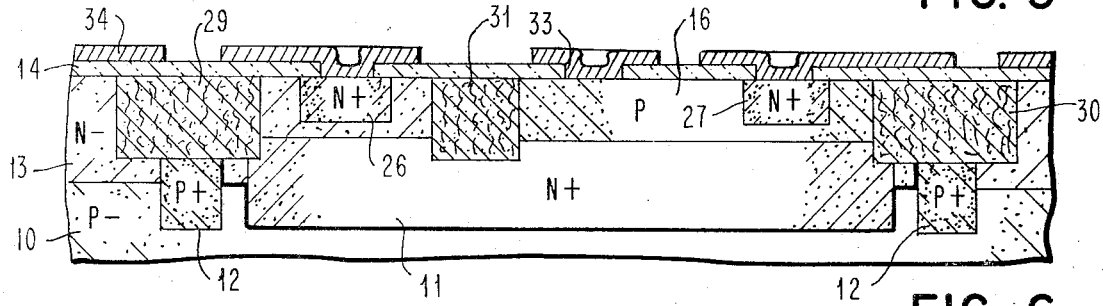

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 1, 1974

918 O.G. 105

T918,008

INTEGRATED CIRCUIT STRUCTURE ELECTRICALLY ISOLATED BY A COMBINATION OF AMORPHOUS SILICON WALLS AND ISOLATING PN JUNCTION

Karl Brack, Bobingen, Germany, and Majid Ghafghaichi and Hans Wimpfheimer, Poughkeepsie, N.Y., assignors to International Business Machines Corporation, Armonk, N.Y.

Filed July 27, 1973, Ser. No. 383,229
**Int. Cl. H01l *19/00***
U.S. Cl. 317—235 R
1 Sheet Drawing. 15 Pages Specification

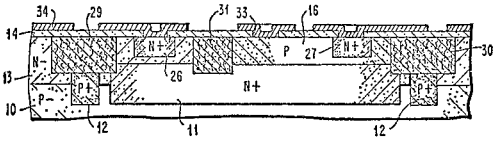

A planar monocrystalline silicon integrated circuit structure having a plurality of electrically isolated pockets extending from the silicon substrate surface. Each pocket is isolated by sidewalls of amorphous silicon, formed by the bombardment of the silicon substrate with silicon ions, laterally enclosing an upper portion of the pocket and an isolating junction continuous with said sidewalls enclosing the lower portion of the pocket.

Each isolated pocket is silicon of one conductivity type, and said isolating junction is formed by a silicon region of opposite conductivity type abutting the pocket. The pockets contain regions of only said opposite conductivity type extending from the surface into the pocket but spaced from said sidewalls and isolating junctions. The structure avoids the problem of parasitic capacitances which tend to occur in completely junction isolated integrated circuits along vertical junctions. By limiting the structure to only regions of opposite conductivity type diffused into pockets of said one conductivity type, the structure avoids vertical PN junctions which are adjacent to each other and, thus, are subject to parasitic capacitance effects.

INTEGRATED CIRCUIT STRUCTURE ELECTRICALLY ISOLATED BY A COMBINATION OF AMORPHOUS SILICON WALLS AND ISOLATING PN JUNCTION

Filed July 27, 1973